United States Patent

Sato et al.

[11] Patent Number: 6,159,301
[45] Date of Patent: Dec. 12, 2000

[54] SUBSTRATE HOLDING APPARATUS FOR PROCESSING SEMICONDUCTOR

[75] Inventors: Kiyoshi Sato; Mikio Shimizu, both of Tama; Toshihiko Hanamachi; Shinya Miyaji, both of Yokohama, all of Japan

[73] Assignees: ASM Japan K.K., Tokyo; NHK Spring Co., Ltd., Kanagawa, both of Japan

[21] Appl. No.: 09/213,463

[22] Filed: Dec. 17, 1998

[30] Foreign Application Priority Data

Dec. 17, 1997 [JP] Japan .................................... 9-363709

[51] Int. Cl.⁷ .................................................. C23C 16/00
[52] U.S. Cl. ........................... 118/728; 118/724; 118/725; 118/723 E
[58] Field of Search .................... 118/728, 724, 118/725, 723 E

[56] References Cited

U.S. PATENT DOCUMENTS

| | | | |
|---|---|---|---|
| 5,665,166 | 9/1997 | Deguchi et al. | 118/723 E |
| 5,766,364 | 6/1998 | Ishida et al. | 118/725 |
| 5,851,298 | 12/1998 | Ishii | 118/728 |

FOREIGN PATENT DOCUMENTS

| | | |
|---|---|---|
| 62-134924 | 6/1987 | Japan . |
| 06132221 | 5/1994 | Japan . |

*Primary Examiner*—Gregory Mills
*Assistant Examiner*—Parviz Hassanzadeh
*Attorney, Agent, or Firm*—Knobbe, Martens, Olson & Bear, LLP

[57] ABSTRACT

A substrate-holding apparatus for holding a semiconductor substrate in a semiconductor processor is characterized in that the apparatus includes a mount block made of, e.g., aluminum nitrate with a high-frequency electrode embedded therein and a heating block made of, e.g., an aluminum alloy with a heating body embedded therein. The mount block is tightly attached to the heating block by engaging the bottom surface of the mount block with the top surface of the heating block, for example, by using a latching mechanism.

7 Claims, 5 Drawing Sheets

SUBSTRATE HOLDING APPARATUS FOR PROCESSING SEMICONDUCTOR

BACKGROUND OF THE INVENTION

1. Field of the Invention

The present invention relates to a substrate holding apparatus for holding a semiconductor substrate in semiconductor processing equipment and, more particularly, to a structure of a susceptor for holding a substrate in plasma CVD equipment.

2. Description of the Related Art

Conventional susceptors used in plasma CVD equipment comprises an electrode made of aluminum or aluminum alloy which has been anodized on the surface thereof as disclosed in U.S. Pat. No. 5,039,388. This is to provide a susceptor with resistance to fluorine in order to prevent it from generating a contaminant as a result of a reaction with active species in fluorine during plasma etching using a gas including fluorine atoms to clean the interior of the reaction chamber. However, cracks can occur on the surface of a conventional anodized susceptor in a plasmatic environment at about 400° C., and this has resulted in a problem in that fluorine based active species penetrate into the cracks and react with aluminum to generate a contaminant.

Under such circumstances, susceptors have been developed which are formed by a ceramic material having a high frequency electrode embedded therein. This approach takes advantage of the fact that ceramic materials such as aluminum nitride are resistant to fluorine based active species and are excellent in thermal conductivity. However, early susceptors of this type had poor thermal efficiency and were not preferable in process stability because semiconductor substrates on such susceptors were heated by radiation heat from a lamp in a room separated from the vacuum reaction chamber.

The next generation of this type susceptors were those which were manufactured by embedding both of an electrode and a heater wire within aluminum nitride to provide a heating portion and a mount portion (electrode portion) in the same structure. Such integration solves the problem of heat efficiency because a semiconductor substrate can be heated directly instead of being indirectly heated as described above.

While the interior of a reaction chamber of plasma CVD equipment is cleaned by means of plasma etching using a gas including fluorine atoms as described above, parts such as a shower head which are technically difficult to manufacture from ceramic materials are manufactured from aluminum alloys and the like as in the prior art. As a result, corrosion is caused by fluorine active species to generate a contaminant. Such a contaminant sticks to the inner wall of a reaction chamber and especially to the surface of a susceptor. Thus, even if the interior of a reaction chamber is cleaned through plasma etching, a new contaminant sticks to the surface of the susceptor. In order to eliminate such a contaminant, the susceptor must be periodically removed for cleaning and maintenance. In this case, since it takes a very long time to remove and clean such an integrated susceptor, the apparatus must be stopped for a long time. This results in the problem of reduced productivity. A problem arises also from the viewpoint of cost in that a susceptor made of aluminum nitride having an integrated structure is quite expensive.

It is therefore an object of the invention to provide a substrate holding apparatus which is highly resistant to fluorine based active species and free from the risk of contamination caused by impurities.

It is another object of the invention to provide a substrate holding apparatus which can be easily replaced and cleaned, thereby improving productivity.

It is still another object of the invention to provide a substrate holding apparatus at a low cost, thereby reducing the operating cost of such an apparatus.

SUMMARY OF THE INVENTION

In order to achieve the above-mentioned objects, a substrate holding apparatus according to the present invention comprises means described below.

A substrate holding apparatus for holding a semiconductor substrate in semiconductor processing equipment comprises:

a mount block with a high-frequency electrode being embedded therein and having a mount surface for mounting the semiconductor substrate;

a heating block having a heater body embedded therein for heating the semiconductor substrate; and the mount block being tightly attached to the heating block by forcing its bottom surface to be detachably engaged with the top surface of the heating block.

Preferably, the mount block is made of aluminum nitride, and the heating block is made of aluminum alloy.

A substrate holding apparatus according to the invention further includes a lock mechanism for causing the bottom surface of the mount block to be detachably engaged with the top surface of the heating block.

Specifically, the lock mechanism comprises:

at least one projection provided on the bottom surface of the mount block; and at least one opening provided in the top surface of the heating block.

Further, the projection is specifically formed of a conductive elastic member.

Further, the lock mechanism may include a conductive member for fixing the projection and for causing the high-frequency electrode and the elastic member to be electrically coupled together.

The elastic member is preferably made of nickel-chrome based heat-resistant alloy.

The conductive member is made of iron-nickel-cobalt based low-thermal-expansion alloy, titanium, molybdenum or iron-nickel based alloy.

DETAILED DESCRIPTION OF PREFERRED EMBODIMENT

Figure 1:
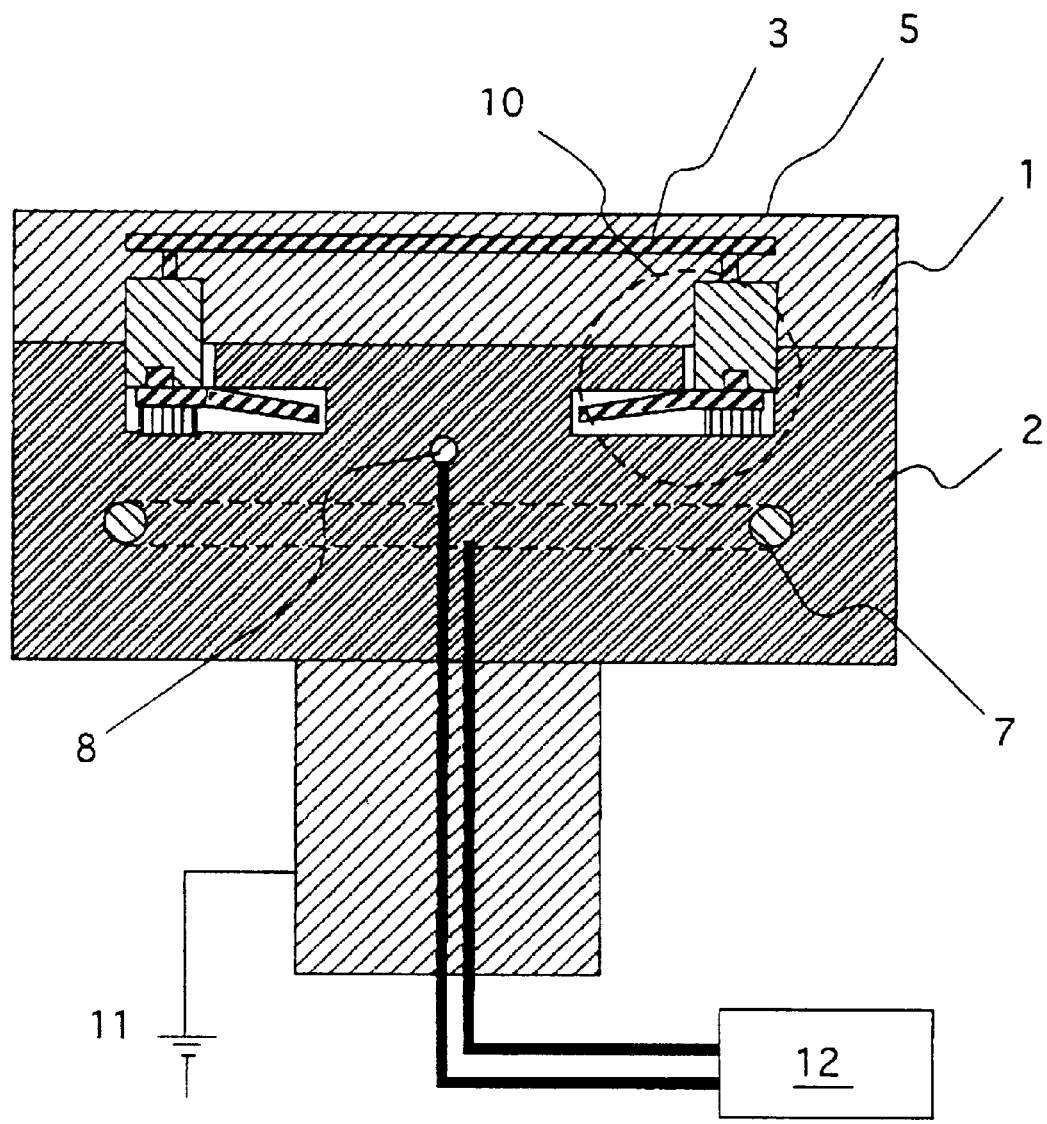
FIG. 1 is a sectional view of a preferred embodiment of a substrate holding apparatus according to the present invention.

FIG. 1 schematically illustrates a sectional view of a preferred embodiment of a substrate holding apparatus according to the present invention. The substrate holding apparatus of the invention comprises a mount block 1 with a high-frequency electrode 3 embedded therein and having a mount surface 5 for mounting a semiconductor substrate, and a heating block 2 having a heating body 7 embedded therein for heating the semiconductor substrate. Preferably, the mount block 1 is a disc-shaped body having a diameter in the range from 230 mm to 350 mm and a thickness in the range from 3 mm to 9 mm made of aluminum nitride, and the heating block 2 is a cylindrical body having a diameter in the range from 230 mm to 350 mm and a thickness in the range from 20 mm to 100 mm made of aluminum alloy. As described below in detail, the mount block 1 is detachably engaged with the heating block 2 by a lock mechanism 10. A temperature sensor 8 for monitoring the processing temperature of a semiconductor substrate is provided in the heating block 2. Preferably, the temperature sensor 8 is a thermocouple made of platinum and platinum-rhodium. The temperature monitored by the temperature sensor 8 is transferred to a PID temperature controller 12 which controls the power to the heating body 7. The heating body 7 is preferably a sheath heater incorporating a nichrome wire embedded in the heating block, but other heat-generating resistors may be used. While the high-frequency electrode 3 is preferably made up of a disc-shaped sheet of molybdenum foil having a thickness of 0.1 mm, it may be a net made of molybdenum or tungsten. Further, the high-frequency electrode 3 is electrically connected to the heating block 2 through the lock mechanism 10, and the heating block 2 is connected to the earth 11.

Figure 2:
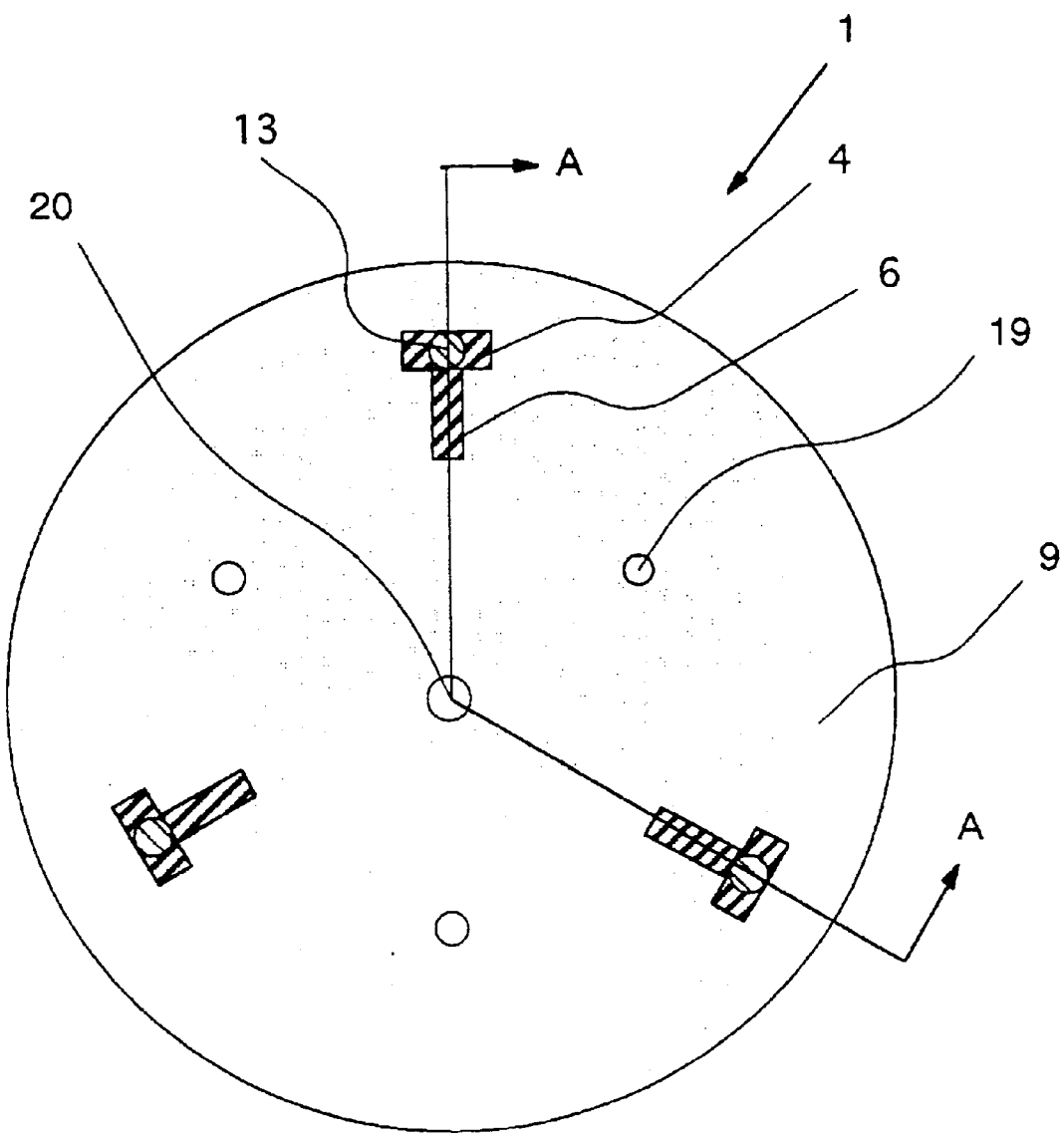
FIG. 2 illustrates the bottom surface of a mount block of the substrate holding apparatus in FIG. 1.

FIG. 2 illustrates the bottom surface 9 of the mount block 1 of the substrate holding apparatus according to the present invention. Three metal projections 6 forming part of the lock mechanism 10 are provided on the bottom surface 9 at equal intervals. While the projections 6 are shown as provided in three locations here, they may be provided in more or fewer locations. While the projections 6 are preferably rectangular pieces of sheet metal, they may have any other configuration including circular, triangular and semispherical configurations. While the projections 6 are preferably inconel flat springs made of nickel-chrome based heat-resistant alloy, they may be other elastic members having good anti-heat and anti-corrosion properties. The projections 6 are secured to a conductive member 4 made of metal with bolts 13, and the conductive member 4 is electrically connected to the high-frequency electrode 3 embedded in the mount block 1. While the bolts 13 are preferably made of nickel-chrome based heat-resistant alloy, they may be other elastic members having good anti-heat and anti-corrosion properties. While the conductive member 4 is preferably made of Fe—Ni—Co based low-thermal-expansion alloy, other low-thermal-expansion alloys such as titanium based and Fe—Ni based alloys having good anti-corrosion properties may be used. A nonthrough hole 20 is provided in the center of the bottom surface 9 into which a locating pin is inserted. Three through holes 19 are provided around the nonthrough hole at equal intervals to receive hold rods for lifting up a semiconductor substrate to pick up the substrate.

Figure 3:
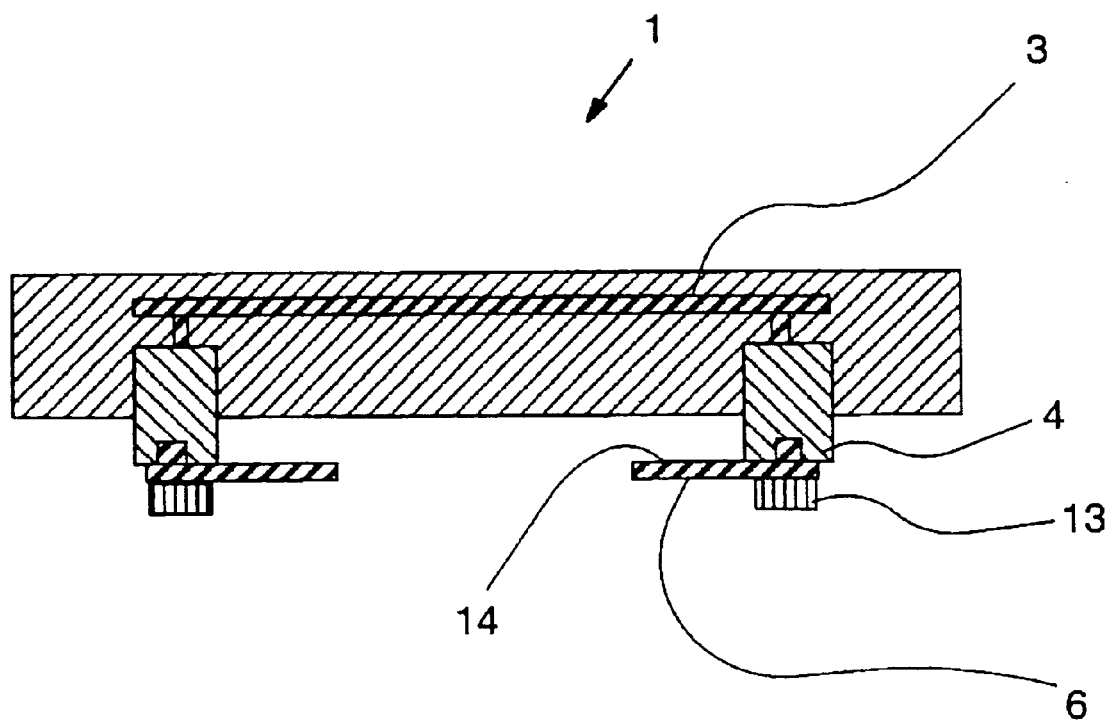
FIG. 3 is a sectional view taken along the line A—A in FIG. 2.

FIG. 3 shows a sectional view taken along the line A—A in FIG. 2. As illustrated, the projections 6 forming part of the lock mechanism 10 in FIG. 1 are preferably constituted by inconel flat springs in the form of thin plates. The projections 6 have an upper end face 14 and, as described below, the upper end face 14 is elastically engaged with an inner end face 15 of an opening 17 provided in the upper surface 16 of the heating block. The mount block 1 is formed by sintering aluminum nitride with a high-frequency electrode 3 embedded therein. The conductive member 4 is soldered to the aluminum nitride using the active metal method. While the projections 6 are fastened by the bolts 13 to be secured to the conductive member 4, they may alternatively be directly brazed to the conductive member 4 without using the bolts 13.

Figure 4:
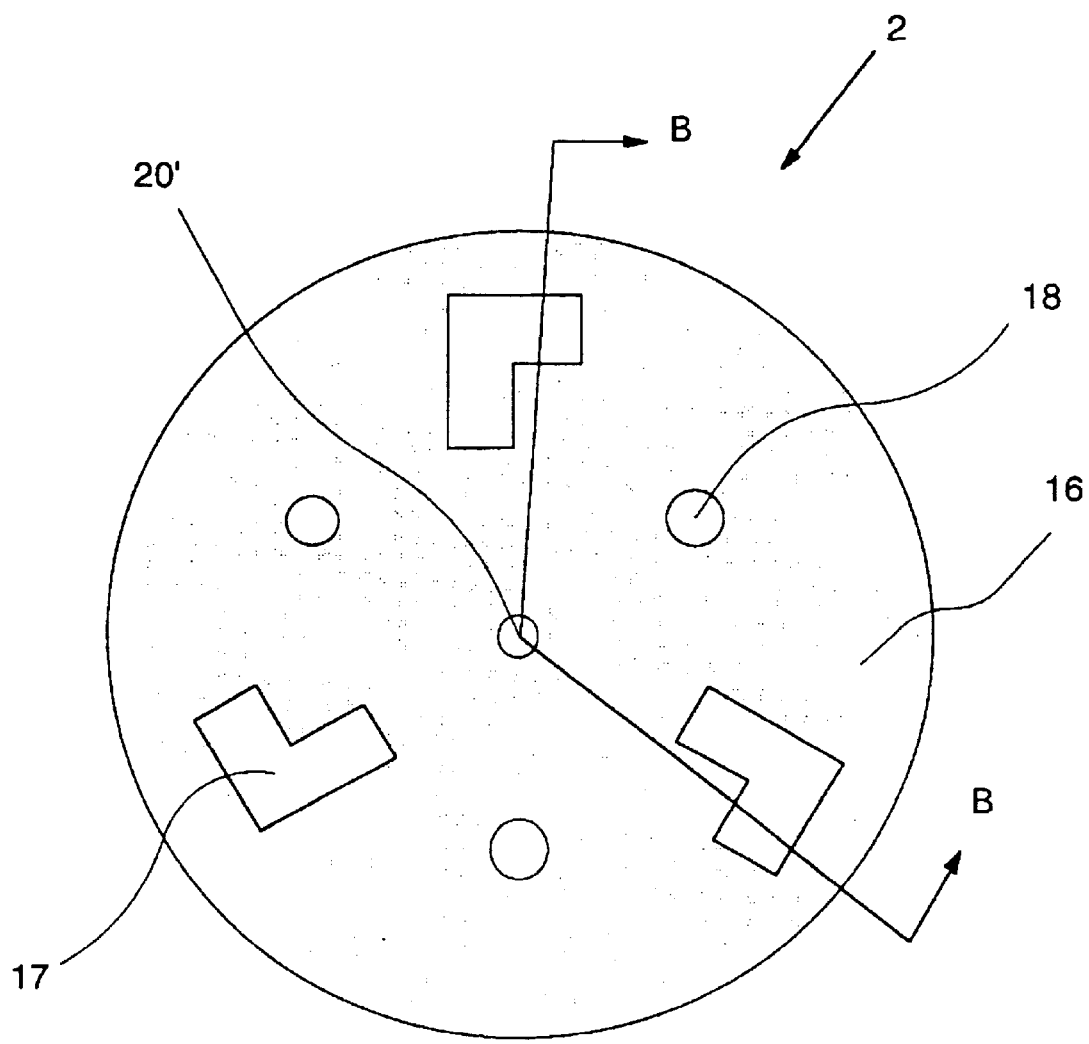
FIG. 4 illustrates the top surface of a heating block of the substrate holding apparatus in FIG. 1.

FIG. 4 is a plan view of the heating block 2 of the substrate holding apparatus according to the present invention. Three openings 17 forming part of the lock mechanism according to the invention are provided at equal intervals on the upper surface 16 of the heating block 2. The intervals and size of the openings 17 are chosen so that they can receive the projections 6. While the openings 17 have an L-shaped configuration, they may be in other configurations. That is, the configuration, quantity, size and intervals of the opening 17 can be arbitrarily selected to adapt them to the projections. A nonthrough hole 20' is provided in the center of the surface 16 to which a locating pin is inserted. Further, three through holes 18 are provided around the nonthrough hole at equal intervals to receive hold rods for lifting up a semiconductor substrate to pick up the same.

Figure 5:
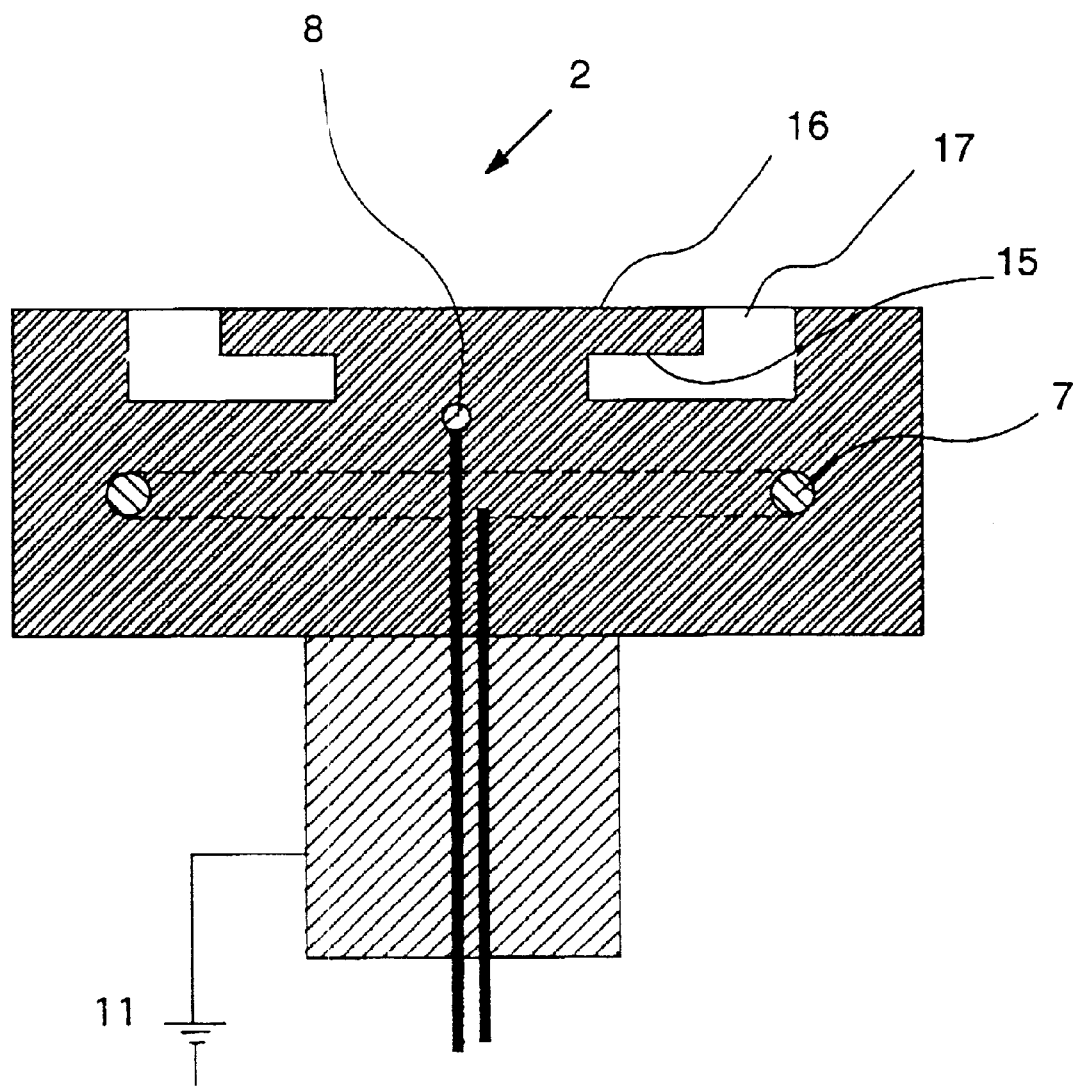
FIG. 5 is a sectional view taken along the line B—B in FIG. 4.

FIG. 5 shows a sectional view taken along the line B—B in FIG. 4. The heating block 2 is formed by casting an aluminum alloy so that a heating body 7 and a temperature sensor 8 are embedded therein. Preferably, the heating body 7 and temperature sensor 8 are contained in sheaths made of stainless steel and embedded in the aluminum alloy. While the sheaths for the heating body 7 and temperature sensor 8 are preferably made of 316L stainless steel, nickel based alloys such as inconel and other materials having good anti-corrosion properties may be used. While aluminum alloy for casting is preferably made of AC7A materials, other general aluminum alloy casting materials may be used. While the openings 17 provided on the upper surface 16 of the heating block 2 are preferably processed by brazing an aluminum alloy plate which has been processed in a predetermined shape in advance to the surface, they may be formed by directly processing the surface 16 of an aluminum alloy. The openings 17 preferably have an inner end face 15 which is engaged with the upper end face 14 of the projection 6. By rotating the mount block 1 with the projections 6 thereof inserted in the openings 17 of the heating block 2, the upper end faces 14 of the projections 6 can be elastically engaged with the inner end faces 15 (see FIG. 1) to allow the mount block 1 to be tightly attached to the heating block 2 easily. Further, by rotating the mount block 1 in the opposite direction, only the mount block 1 can be easily removed.

A description will now be made on the lock mechanism 10 which is one of the features of the invention. The block mechanism 10 according to the invention is formed by at least one projection 6 provided on the bottom surface 9 of the mount block 1 and at least one opening 17 provided in the surface 16 of the heating block 2. Preferably, the projection 6 is constituted by an inconel flat spring made of Ni—Cr based heat-resistant alloy and is electrically connected to the high-frequency electrode 3 through the conductive member 4 made of Fe—Ni—Co based low-thermal-expansion alloy. FIG. 1 shows a state in which the mount block 1 is tightly attached to the heating block 2. As above-mentioned, the mount block 1 can be tightly attached by inserting the projections 6 into the openings 7 and rotating it to force the upper end faces 14 of the projections 6 to be elastically engaged with the inner end faces 15 of the openings 17.

An advantage as described below is provided by forcing the mount block 1 and heating block 2 to be elastically engaged with each other as described above. From a comparison between thermal expansion coefficients $4.9 \times 10^{-6}$/K and $23 \times 10^{-6}$/K of aluminum nitride which is the material of the mount block 1 and an aluminum alloy which is the material of the heating block 2, respectively, it is understood that the aluminum alloy tends to be much more easily subjected to thermal expansion. When they are completely fixed with bolts, the difference between their thermal expansion coefficients causes a significant distortion, which can lead to a gap at the interface between them or cracks on the part of aluminum nitride. With the lock mechanism of the invention that provides elastic engagement, no gap is formed between them even if there is any dimensional change attributable to thermal expansion and contraction because vertical movement is suppressed by the force of the spring, and horizontal movement is absorbed by a margin between the inner side walls of the openings 17 and the projections 6 to some extent and is also limited by the spring. Thus, the lock mechanism according to the invention makes it possible to maintain tight attachment between the mount block 1 and heating block 2 in a temperature range from the room temperature to 450° C.

By forming a surface for mounting a semiconductor substrate from aluminum nitride, it is possible to provide a susceptor having high resistance to fluorine based active species and to thereby reduce the risk of contamination by impurities significantly.

Further, a substrate holding apparatus has a structure separated into a mount block and a heating block, and a mechanism is provided to allow them to be easily attached and separated. This makes it possible to remove only the mount block to conduct maintenance of the same, thereby reducing the operating time significantly. As a result, an apparatus halt time for maintenance can be minimized to improve productivity.

Further, since the mount block and heating block can be tightly put together, the processing temperature during a process can be maintained stable.

Furthermore, since only the mount block is made of aluminum nitride and the heating block is made of aluminum alloy, the manufacturing cost of an apparatus can be significantly reduced.

What is claimed is:

1. A substrate-holding apparatus for holding a semiconductor substrate inside a semiconductor processor, said apparatus comprising:

a mount block with a high-frequency electrode being embedded therein, said mount block having a mount surface for mounting a semiconductor substrate thereon, and a bottom surface, said mount block being made of aluminum nitride;

a heating block having a heater body embedded therein for heating said semiconductor substrate, said heating block being made of an aluminum alloy and having a top surface; and a lock mechanism comprising male and female fitting members to engage the bottom surface of the mount block and the top surface of the heating block, said male fitting members being provided in either of the mount block or the heating block, said female fitting members being provided in the other of the mount block or the heating block, said male and female fitting members being engaged or disengaged by rotating the mount block with respect to the heating block, wherein the mount block and the heating block are detachably interlocked with use of said male and female fitting members.

2. The substrate-holding apparatus as recited in claim 1, wherein said male and female fitting members comprising:

at least one projection as provided on the bottom surface of said mount block; and at least one opening provided in the top surface of said heating block.

3. The substrate holding apparatus as recited in claim 2, wherein said projection is comprised of a conductive elastic member.

4. The substrate holding apparatus as recited in claim 3, wherein said lock mechanism further includes:

a conductive member for fixing said projection and for causing said high-frequency electrode and said elastic member to be electrically coupled together.

5. The substrate holding apparatus as recited in claim 4, wherein said conductive member is made of iron-nickel-cobalt based low-thermal-expansion alloy, titanium, molybdenum, or iron-nickel based alloy.

6. The substrate holding apparatus as recited in claim 3, wherein said elastic member is comprised of nickel-chrome based heat-resistant alloy.

7. The substrate-holding apparatus as recited in claim 1, wherein each of the mount block and the heating block is formed with an integrated block.

* * * * *